United States Patent [19]
Ortman et al.

[11] Patent Number: 5,266,893
[45] Date of Patent: Nov. 30, 1993

[54] METHOD AND APPARATUS FOR TESTING VCR SERVOS

[76] Inventors: Ross Ortman, 11301 Kuhle Dr., Sioux Falls, S. Dak. 57107; Corwyn R. Meyer, 3820 Ronning Dr., Sioux Falls, S. Dak. 57103

[21] Appl. No.: 685,663

[22] Filed: Apr. 16, 1991

[51] Int. Cl.[5] ............................................. G01R 31/02
[52] U.S. Cl. .............................. 324/158 SM; 324/161
[58] Field of Search ............... 324/158 SM, 161, 166; 369/53; 360/137; 358/325, 326

[56] References Cited
U.S. PATENT DOCUMENTS
4,316,143  2/1982  Castle ................................ 324/161

FOREIGN PATENT DOCUMENTS
0220863  11/1985  Japan ................................... 324/161
297925    5/1971   U.S.S.R. ............................... 324/161
308359    8/1971   U.S.S.R. ............................... 324/161

OTHER PUBLICATIONS
Zimmerman, R. H.; "Measuring Frequency Deviation"; Electronic Industries; Jun. 1965; pp. 100, 101, 107; copy in 324-161.

Primary Examiner—Ernest F. Karlsen
Attorney, Agent, or Firm—Edmond T. Patnaude

[57] ABSTRACT

The capstan and drum servo systems of a VCR are tested by processing the capstan reference signal and the drum reference signal in a microprocessor and displaying information which is useful in diagnosing any defects in either of the servo systems.

4 Claims, 1 Drawing Sheet

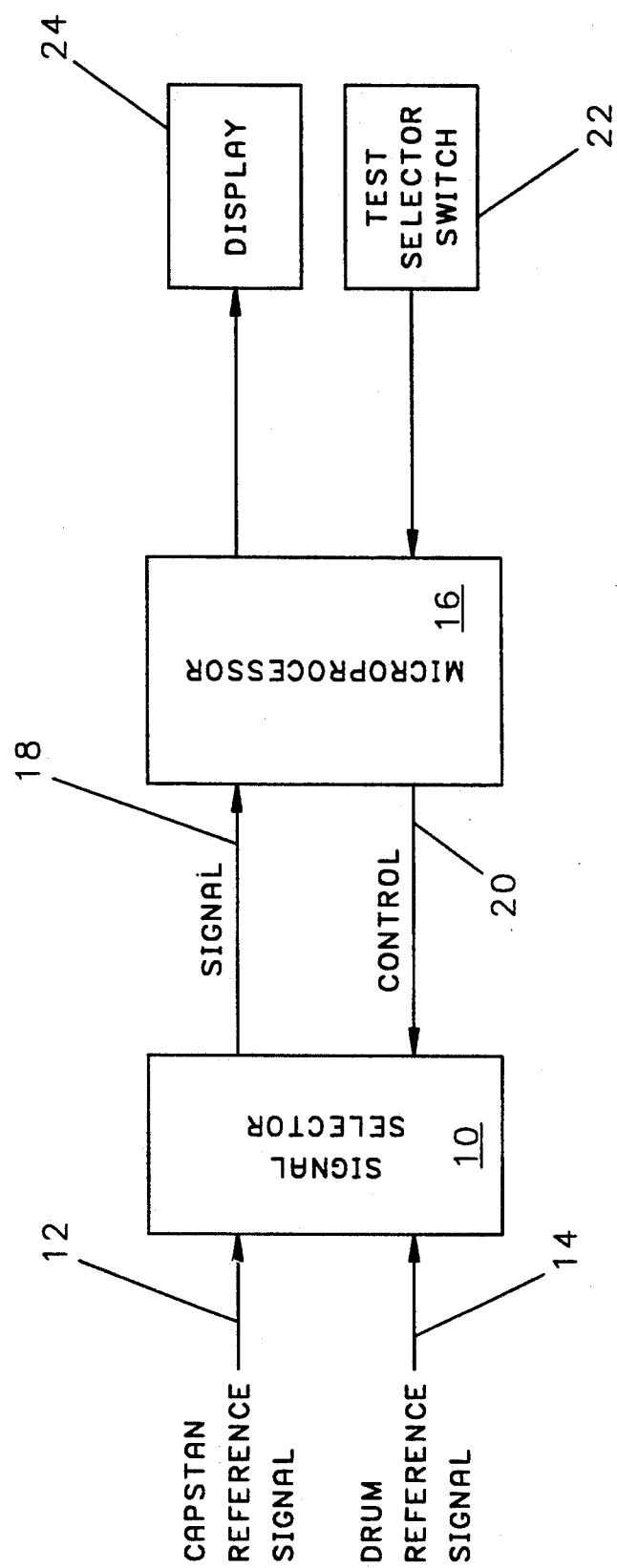

METHOD AND APPARATUS FOR TESTING VCR SERVOS

The present invention relates in general to new and improved methods and apparatus for determining if the drum and capstan servos of a VCR are operating properly, and it relates more particularly to a method and apparatus which uses the capstan and drum reference signals to identify a defective drum or capstan servo.

BACKGROUND OF THE INVENTION

Present day VCRs employ two closed loop servo systems, one to control the operation of the rotating video heads and the other to control the speed that the video tape moves past the heads. One of these servos is called the capstan servo, and the other is the called the drum servo. However, in addition to these two servo loops, there is a third servo loop which results from the interaction of the capstan and drum servo loops because of the common usage of the same video tape which carries the recorded information.

The capstan servo controls the speed at which the video tape travels through the machine. The speed and position of the video tape must be precisely controlled in order to ensure that the video tape is in the correct position relative to the video heads in the rotating video drum. Moreover, the video tape must move past the audio heads at the prescribed speed. To this end, a capstan reference signal is recorded linearly on the tape for use in identifying the exact position of the video tape relative to the video heads. In order to control the speed at which the video tape is being pulled through the machine, the capstan reference signal is compared to an internal reference signal. If necessary, the speed of the capstan is adjusted, based on a comparison of these two reference signals, to place the recorded signals on the video tape at the proper position to be sensed by the video and audio heads.

The drum servo controls the rotational position of the video heads. In order to control the drum servo a drum reference signal is generated by the drum, and this signal is compared to the same internal reference signal used by the capstan servo to determine the speed and position of the video heads in the drum. If these two reference signals are out of sync, the drum servo corrects the speed and position of the drum to properly position the heads relative to the tape.

If the capstan servo is not operating correctly, the video tape will travel too fast or too slowly past the audio heads, and the audio will have a higher or lower pitch than that which was linearly recorded on the tape. Moreover, since the video tape will be moving past the drum at an incorrect speed, the video heads will be unable to track along on the recorded tracks resulting in a loss of video. Major speed deviations will cause noticeable changes in the linear audio frequency and result in noticeably high repetition rates of noise in the video picture. Minor speed variations may not produce noticeable changes in the audio but will produce visible noise in the picture.

An improperly operating drum servo will cause video problems, but will not adversely affect the linearly recorded audio signal. For example, severe errors in the speed of the video drum will cause the horizontal sync pulses to occur too fast or too slow and result in the picture being tipped to one side or the other. Minor speed or phase variations of the drum from the norm will produce periods of noise in the picture, and this noise appears identical to that caused by a minor variation in the speed of the capstan. As a consequence, this symptom can result in a misdiagnosis of the problem and an attempt to repair or replace the wrong servo.

The failure of other non-related components in the VCR can also cause symptoms that may be misdiagnosed as a servo problem. For example, misalignment of the tape path as well as defects in the video signal processing circuits can cause video noise, noise bars, or other symptoms that sometime look the same as the results of a defective servo loop. A major problem in servicing VCRs is, therefore, that of identifying the section of the VCR that is defective.

Since servo problems are not always confined to the electrical portions of the servos, mechanical defects such as dry or damaged motor bearings, slipping belts or idlers, or residue buildup along the tape path can result in a whole different set of symptoms such as an excessive variation in the audio and video signals.

At the present time servo testing relies on observing the video and listening to the audio in an effort to detect any errors which may occur therein. In addition, other instruments such as oscilloscopes are used to observe the capstan and drum reference signals and other signals relating to the specific servo technology used by the VCR under test. The internal reference signal is not normally available to the service technician and cannot, therefore, be used in troubleshooting. For the reasons explained above, misdiagnosis of servo problems and the needless waste of time and replacement of good components has been a major concern in the servicing of VCRS.

SUMMARY OF THE INVENTION

Briefly, there is provided in accordance with the present invention a new and improved method and instrument for use in testing and analyzing the operation of a VCR to determine if a fault exist therein, and if such a fault exists, identifying which servo system is malfunctioning. This method employs a series of five separate tests. The first of these tests is used to determine if the servos are locked up or not. The remaining four tests are used to analyze the various operations of the servos and to identify which servo Is at fault.

The instrument of the present invention includes a pair of input jacks to which the drum and capstan reference signals are respectively connected, a microprocessor, a signal selector for selecting either the drum reference signal or the capstan reference signal, a test selector switch for selecting one of the five tests, and a visual display for showing the results of the tests.

GENERAL DESCRIPTION OF THE DRAWING

A better and more complete understanding of the present invention may be had from a reading of the following detailed description taken in connection with the accompanying drawing which is a block circuit diagram of an instrument for testing the servo systems of a VCR.

DETAILED DESCRIPTION OF A PREFERRED EMBODIMENT OF THE INVENTION

Referring to the drawing, a VCR analyzer circuit includes a signal selector 10 having first and second input leads 12 and 14 for respective connection to the appropriate terminals of the VCR under test for connecting the capstan reference signal to the lead 12 and the drum reference signal to the lead 14. The instrument further includes a microprocessor 16 which is connected to the signal selector 10 for receiving information signals therefrom via a line 18 and for supplying control signals thereto via a line 20. A multiple position test selector switch 22 having one off position and five operative test positions is connected to the microprocessor 16, and a display 24 is also connected to the microprocessor 16.

With the selector switch 22 in the first test position, called the "SERVOS LOCKED" position, the relationship of the capstan reference signal to the drum reference signal is sensed. If these two references are both solidly locked to the internal reference signal of the VCR, they will not change phase relative to one another indicating that the two servo systems are operating properly. If, on the other hand, the two servo systems are not completely locked to the internal reference signal of the VCR, the capstan and reference signal will move relative to one another indicating that one or both of the servo systems is not operating properly because of a mechanical or electrical fault.

Having determined that a problem with the servos exists, the remaining four tests are then used to analyze the capstan and drum reference signals to determine which of the servos is defective. The first of these tests to be performed is the "CAPSTAN SPEED ERROR" test.

The "CAPSTAN SPEED ERROR" test is used to determine if the capstan servo is maintaining the capstan at the correct predetermined speed, i.e. is the servo control circuit operating properly. In this test the microprocessor operates the signal selector 10 to connect the capstan reference signal to the microprocessor and compares the average frequency of the capstan reference signal to an internally stored standard reference signal to determine if the capstan reference signal is at the correct frequency. If the capstan servo system is malfunctioning, the signals will not match and an error signal will be displayed by the display 24 indicating a capstan servo speed problem. Ordinarily, a capstan speed error is caused by a missing linear reference signal, a missing or incorrect internal reference signal, or a bad speed selector circuit in the VCR.

The next test to be performed is the "DRUM SPEED ERROR" test and the switch 22 is manually operated to select this test. This test is similar to the "CAPSTAN SPEED ERROR" test in that the microprocessor 16 selects the drum reference signal and mathematically compares the average frequency thereof to an internally stored standard drum frequency signal. If the drum servo system is functioning correctly, the average drum reference signal frequency will match the standard frequency. However, if the frequencies are not the same, the direction and value of the difference will be displayed. By noting this value on the display an experienced service technician can determine if the problem is in the drum servo section of the VCR. The most common cause of drum speed error Is a missing drum reference signal or a missing internal reference signal.

The next test to be performed is the "CAPSTAN JITTER" test. It is used to determined if any rapid changes in the frequency of the capstan reference signal are occurring. In order to perform this test the service technician actuates the test selector switch to select the "CAPSTAN JITTER" test which causes the microprocessor to operate the signal selector 10 to connect the capstan reference signal to the microprocessor. The microprocessor then measures the high and low values of the frequency of the capstan reference signal over a predetermined time of about one second and calculates and displays the deviation or jitter of the frequency of the capstan reference signal as a percentage. A properly functioning capstan servo system will provide a capstan reference signal having a precise and stable frequency. Excessive jitter indicates that the capstan servo system may not be locking at the correct speed and is searching for the correct speed or that there may be a mechanical failure which is causing the video tape to move unevenly through the machine. The most common cause of capstan jitter is mechanical although a missing capstan reference signal is also common.

The final test to be performed is the "DRUM JITTER" test. It is made by using the test selector switch 22 to select the "DRUM JITTER" test which causes the microprocessor 16 to control the signal selector 10 to connect the drum reference signal to the microprocessor. This test is similar to the "CAPSTAN JITTER" test and measures the high and low frequency components of the drum reference signal over a period of time and compares them to one another to determine the deviation of the highs and lows from one another. Any deviation or jitter is displayed as a percentage. A properly functioning drum servo system will have little or no jitter. The most common cause of drum jitter is mechanical. However, drum jitter can also be caused by a missing drum reference signal.

The method and apparatus of the present invention can, therefore, enable the service technician to accurately determine if the servo systems are functioning correctly, and if not, which servo system is at fault and what in particular is most likely to be causing the problem.

While the present invention has been described in connection with a particular embodiment thereof, it will be understood by those skilled in the art that many changes and modifications may be made without departing from the true spirit and scope of the invention. Therefore, it is intended by the appended claims to cover all such changes and modifications which come within the true spirit and scope of the invention.

I claim:

1. A method testing the servo systems of a VCR in which capstan and drum reference signals are produced, comprising the steps of:

sensing the respective frequencies of said capstan and drum reference signals, comparing said capstan and drum reference signals to one another to detect any change in the relative phases of said reference signals, displaying an indication of whether there is any change in the relative phases of said reference signals, providing a signal having a standard reference frequency, measuring the average frequency of said drum reference signal over a plurality of cycles, comparing said average frequency to said standard frequency, and displaying the difference, if any, between said frequencies.

2. A method of testing the servo systems of a VCR in which capstan and drum reference signals are produced, comprising the steps of:

sensing the respective frequencies of said capstan and drum reference signals, comparing said capstan and drum reference signals to one another to detect any change in the relative phases of said reference signals, displaying an indication of whether there is any change in the relative phases of said reference signals, sensing and recording the high and low values of said capstan reference signal, calculating the deviation between said high and low values, and displaying said deviation.

3. A method of testing the servo systems of a VCR in which capstan and drum reference signals are produced, comprising the steps of:

sensing the respective frequencies of said capstan and drum reference signals, comparing said capstan and drum reference signals to one another to detect any change in the relative phases of said reference signals, displaying an indication of whether there is any change in the relative phases of said reference signals, sensing and recording the high and low values of the drum reference signal, calculating the deviation between said high and low values, and displaying said deviation.

4. A method of testing the servo systems of a VCR in which capstan and drum reference signals are produced, comprising the steps of:

sensing the respective frequencies of said capstan and drum reference signals, comparing said capstan and drum reference signals to one another to detect any change in the relative phases of aid reference signals, displaying an indication of whether there is any change in the relative phases of said reference signals, providing a signal having a standard reference frequency, measuring the average frequency of said capstan reference signal over a plurality of cycles of said capstan reference signal, comparing said average frequency to said standard frequency, and displaying the differences between said frequencies if said frequencies are not the same.

* * * * *